United States Patent [19]

Reitz et al.

[11] Patent Number: 4,598,962

[45] Date of Patent: Jul. 8, 1986

[54] MEMORY DEVICE RETAINING APPARATUS FOR PORTABLE DATA PROCESSOR

[75] Inventors: Christopher J. Reitz, Davie, Fla.; Jeffery C. Barrus, Houston, Tex.

[73] Assignee: Motorola, Inc., Schaumburg, Ill.

[21] Appl. No.: 589,291

[22] Filed: Mar. 14, 1984

[51] Int. Cl.⁴ ............................................. H01R 9/09
[52] U.S. Cl. ................................. 339/17 L; 339/91 R; 361/399
[58] Field of Search ............... 361/394, 395, 399, 415; 339/17 L, 17 LM, 17 LC, 91 R, 186 M; 220/306, 326; 206/387

[56] References Cited

U.S. PATENT DOCUMENTS

| | | | |
|---|---|---|---|
| 3,112,974 | 12/1963 | Curtis et al. | 339/186 M |
| 3,964,816 | 6/1976 | Narozny | 339/99 R |
| 4,030,602 | 6/1977 | Muller et al. | 220/306 |
| 4,327,956 | 5/1982 | Sitzler | 339/107 |
| 4,531,176 | 7/1985 | Beecher, II | 361/399 |

Primary Examiner—Neil Abrams
Attorney, Agent, or Firm—Rolland R. Hackbart

[57] ABSTRACT

Memory device retaining apparatus for plugging software applications programs into a portable data processor includes a cover (100) and a retaining device (150). The software application program is stored in a memory (180) on a circuit board (164) which is held by retaining device (150). Cover (100) is mechanically coupled to retaining device (150) and acts as a handle for easy removal from the portable data processor. Softward applications programs can be changed simply by interchanging retaining devices (150).

8 Claims, 5 Drawing Figures

MEMORY DEVICE RETAINING APPARATUS FOR PORTABLE DATA PROCESSOR

BACKGROUND OF THE INVENTION

The present invention relates generally to retaining apparatus and more particularly to memory device retaining apparatus for inserting software applications programs into a portable data processor.

Conventional memory device retaining apparatus for personal/game computers typically includes a plastic housing which encloses a memory device mounted on a circuit board. The retaining apparatus may be plugged into a mating connector of the personal/game computer. Such conventional retaining apparatus typically protrudes from the personal/game computer so that they may be easily inserted and removed. However, none of such prior memory device retaining apparatus provides for both a cover that is flush mounted with the surface of the personal/game computer and an interchangeable memory device that is mechanically coupled to the cover.

OBJECTS AND SUMMARY OF THE INVENTION

Accordingly, it is an object of the present invention to provide improved memory device retaining apparatus that includes a cover that is mechanically coupleable to many different memory devices.

It is another object of the present invention to provide improved memory device retaining apparatus that includes a cover mechanically coupled to a memory device that is easily inserted and removed from a data processor.

Briefly described, the present invention encompasses memory device retaining apparatus adapted to be plugged into a data processor and comprised of: a cover having first and second ends and first and second elongated sides; and a retaining device mechanically coupled to the cover for retaining a memory. The cover includes first and second guides opposingly located at first and second ends of the cover, respectively. Each guide has one or more elongated slots. The cover further has a third guide located at the first side and fourth and fifth guides having different shapes and located at the second side. The retaining device has a base, first and second posts and first, second and third slots. The first and second posts each have one or more tangs for engaging corresponding slots of the first and second guides, respectively. The first, second and third slots of the retaining device engage the third, fourth and fifth guides of the cover, respectively.

DETAILED DESCRIPTION OF THE PREFERRED EMBODIMENT

Figure 1:
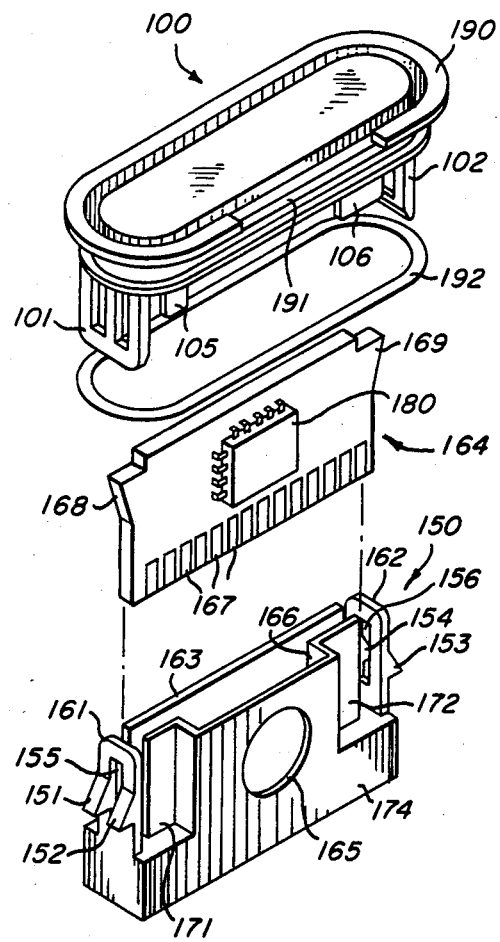
FIG. 1 is a perspective view of memory device retaining apparatus embodying the present invention.

Referring to FIG. 1, there is illustrated memory device retaining apparatus embodying the present invention. The retaining apparatus includes a cover 100 which may be mechanically coupled to a retaining device 150. Retaining device 150 accepts a circuit board 164 having a memory 180 thereon, such as a ROM, and also having an edge connector 167 at one end thereof. The edge connector 167 of circuit board 164 is contacted by connector pins of the portable data processor which insert into holes in the base 174 of retaining device 150 (See FIG. 4). The top side of memory 180 can be viewed by means of hole 165 in retaining device 150. The top surface of memory 180 exposed by hole 165 may include the part number and/or release number identifying the software applications program stored therein. Retaining device 150 inserts into cover 100 which both orients and mechanically holds retaining device 150. Different software applications programs can be mechanically coupled to cover 100 simply by changing retaining device 150.

Referring in more detail to cover 100 in FIG. 1, top 190 is oval shaped having first and second ends and first and second elongated sides. One side of cover 100 has a slot 191 which interlocks with a battery cover of the portable data processor. A suitable data processor having a battery cover is illustrated in co-pending U.S. patent application, Ser. No. 459,156 (now U.S. Pat. No. D. 278,908), filed on Jan. 19, 1983, entitled "Portable Terminal or Similar Article", invented by William Scheid and Robert Steinbugler and incorporated herein by reference thereto. The memory device retaining apparatus of the present invention may be inserted into the bottom of the portable data processor illustrated in the aforementioned patent application. When inserted, cover 100 of the retaining apparatus is flush with the surface of the portable data processor, sealed by ring 192 and interlocked with the battery cover such that the battery cover must be removed before cover 100 can be released. Once released, cover 100 extends out and acts like a handle.

Figure 5:
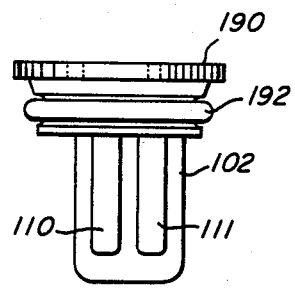
FIG. 5 is a right end view of cover 100 in FIG. 1.

Returning to cover 100 in FIG. 1, first and second guides 101 and 102 are opposingly located at the first and second ends of the cover, respectively. Each guide 101 and 102 include two elongated slots. A side view of cover 100 in FIG. 5 illustrates more clearly the slots 110 and 111 in guide 102. Slots 110 and 111 are preferably sufficiently long to allow cover 100 to act as a handle which, when released by the battery cover, will protrude from the portable data processor so that retaining device 150 can be easily unplugged. Cover 100 further includes third guide 107 located at one side thereof and fourth and fifth guides 105 and 106 having different shapes and located at the other side thereof.

Referring next to retaining device 150 in FIG. 1, first and second posts 161 and 162 each include two tangs 151, 152 and 153, 154 for engaging corresponding slots in the first and second guides 101 and 102, respectively. Tangs 151, 152 and 153, 154 extend beyond base 174 as further illustrated in FIG. 4. Retaining device 150 also includes slots 171, 172 and 173 which are shaped to accept guides 105, 106 and 107 in cover 100, respectively. Since guides 105 and 106 have different shapes, proper orientation of retaining device 150 is insured. In other words guides 105, 106 and 107 will only insert into corresponding slots 171, 172 and 173 when retaining device 150 is properly aligned with cover 100. Circuit board 164 inserts into the gap between walls 163 and 166 of retaining device 150 and is held by means of tangs 168 and 169 which insert into slots in posts 161 and 162. ROM's or other suitable memories 180 located on circuit board 164 are exposed by hole 165 for identification or reprogramming if conventional EPROM's are used.

Figure 2:
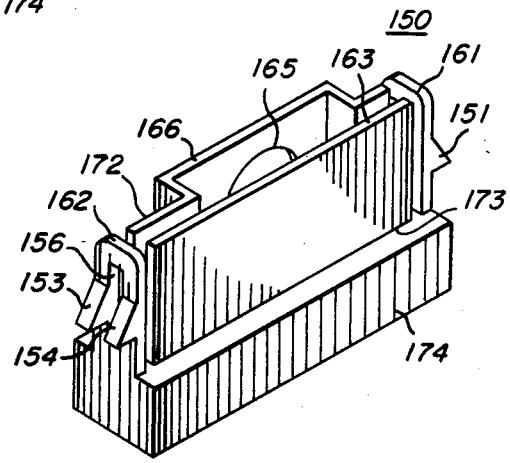
FIG. 2 is a right side perspective view of the memory device 150 in FIG. 1.
Figure 3:
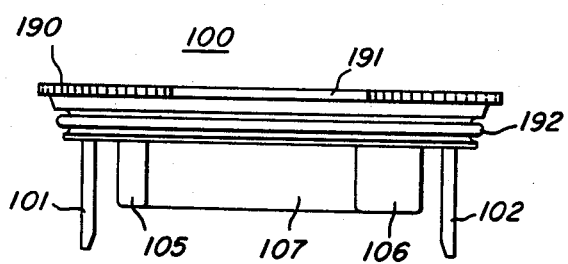
FIG. 3 is a front side view of the cover 100 in FIG. 1.

Referring to FIG. 2, there is illustrated a right side perspective view of retaining device 150 in FIG. 1. Post 162 extends upward from base 174 and includes tangs 153 and 154 and slot 156. Posts 161 and 162 flex to allow tangs 151, 152 and 153, 154 to slip into slots in corresponding guides 101 and 102. Circuit board 164 further includes two tangs 168 and 169 which insert into corresponding slots 155 and 156 in posts 161 and 162, respectively, for securely holding circuit board 164 in the gap between sides 163 and 166 of retaining device 150. Also illustrated in FIG. 2 are slots 172 and 173 which are shaped to accept corresponding guides 106 and 107 of cover 100.

Figure 4:
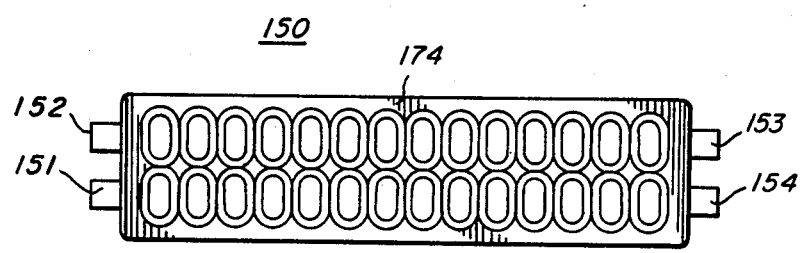
FIG. 4 is a bottom view of the memory device 150 in FIG. 1.

Referring next to FIG. 4, there is illustrated a bottom view of retaining device 150 in FIG. 1. Base 174 of retaining device 150 includes a plurality of holes through which connector pins from the portable data processor insert to contact edge connector 167 of circuit board 164. Tangs 151, 152, and 153, 154 extend beyond the ends of base 174 for inserting into corresponding slots in guides 101 and 102 of cover 100.

In summary, improved memory device retaining apparatus has been described that can be utilized to plug different software application programs into a portable data processor. The unique retaining apparatus properly orients the memory device and provides for easy insertion into and removal from a portable data processor, while at the same time protecting the memory device from undesirable external contact.

We claim:

1. Apparatus for retaining a memory device adapted to be plugged into data processing means, said apparatus comprising:
    a cover having first and second ends and first and second elongated sides adapted to insert into the data processing means, said cover including first and second guides opposingly located at said first and second ends of the cover, respectively, each guide having an elongated slot, and said cover further having a third guide located at the first side and fourth and fifth guides having different shapes and located at the second side; and
    a retaining device mechanically coupled to said cover for retaining the memory device therein, said retaining device having a base, first and second posts and first, second and third slots, said first and second posts each having a tang for engaging the elongated slot of the first and second guides of the cover, respectively, whereby said cover acts as an extendible handle, and said first, second and third slots of the retaining device engaging the third, fourth and fifth guides of the cover, respectively whereby said retaining device is oriented and held by said cover.

2. The apparatus according to claim 1, wherein said data processing means includes a first connector and said memory device comprises:
    a circuit board having a second connector adapted to be coupled to the first connector of the data processing means and having circuitry coupled to the second connector; and
    a memory having leads adapted to be coupled to the circuitry of the circuit board.

3. The apparatus according to claim 2, wherein said first and second posts each further include a slot and said circuit board further includes first and second tangs for engaging corresponding slots of the first and second posts, respectively.

4. The apparatus according to claim 1, wherein said first and second guides of the cover each have first and second elongated and parallel slots, and said first and second posts of the retaining device each have first and second tangs for engaging the first and second slots of the first and second guides, respectively.

5. Memory apparatus attachable to a cover and adapted to be plugged into data processing means said cover having first and second ends and first and second elongated sides adapted to insert into the data processing means, said cover including first and second guides opposingly located at said first and second ends of the cover, respectively, each guide having an elongated slot, and said cover further having a third guide located at the first side and fourth and fifth guides having different shapes and located at the second side, said memory apparatus comprising:
    a memory device; and
    a retaining device mechanically coupled to said cover for retaining the memory device therein, said retaining device having a base, first and second posts and first, second and third slots, said first and second posts each having a tang for engaging the elongated slot of the first and second guides of the cover, respectively, whereby said cover acts as an extendible handle, and said first, second and third slots of the retaining device engaging the third, fourth and fifth guides of the cover, respectively, whereby said retaining device is oriented and held by said cover.

6. The apparatus according to claim 5, wherein said data processing means includes a first connector and said memory device comprises:
    a circuit board having a second connector adapted to be coupled to the first connector of the data processing means and having circuitry coupled to the second connector; and
    a memory having leads adapted to be coupled to the circuitry of the circuit board.

7. The apparatus according to claim 6, wherein said first and second posts each further include a slot and said circuit board further includes first and second tangs for engaging corresponding slots of the first and second posts, respectively.

8. The apparatus according to claim 5, wherein said first and second guides of the cover each have first and second elongated and parallel slots, and said first and second posts of the retaining device each have first and second tangs for engaging the first and second slots of the first and second guides, respectively.

* * * * *